(12) United States Patent
Holcomb et al.

(10) Patent No.: US 9,150,957 B2
(45) Date of Patent: Oct. 6, 2015

(54) METHOD OF MAKING A SPUTTER TARGET AND SPUTTER TARGETS MADE THEREBY

(75) Inventors: M. Kirk Holcomb, Grove City, OH (US); David B. Smathers, Columbus, OH (US)

(73) Assignee: Tosoh SMD, Inc., Grove City, OH (US)

(*) Notice: Subject to any disclaimer, the term of this patent is extended or adjusted under 35 U.S.C. 154(b) by 128 days.

(21) Appl. No.: 12/998,555

(22) PCT Filed: Nov. 3, 2009

(86) PCT No.: PCT/US2009/005945
§ 371 (c)(1),
(2), (4) Date: May 25, 2011

(87) PCT Pub. No.: WO2010/051040
PCT Pub. Date: May 6, 2010

(65) Prior Publication Data
US 2011/0214987 A1   Sep. 8, 2011

Related U.S. Application Data

(60) Provisional application No. 61/198,098, filed on Nov. 3, 2008.

(51) Int. Cl.
*C23C 14/14* (2006.01)
*C23C 14/34* (2006.01)
(Continued)

(52) U.S. Cl.
CPC ............ *C23C 14/3414* (2013.01); *C22C 27/02* (2013.01); *C22F 1/16* (2013.01); *C22F 1/18* (2013.01)

(58) Field of Classification Search
CPC .......... C22C 27/02; C22F 1/00; B21B 1/026; B21B 1/0805; B21B 1/38; B21B 2001/022; B21B 3/00; C23C 14/3414; H01J 37/3491

USPC .......................................... 148/668
See application file for complete search history.

(56) References Cited

U.S. PATENT DOCUMENTS 3,954,514 A * 5/1976 Webster et al. ............... 148/665
4,721,537 A * 1/1988 Ghosh .......................... 148/698

(Continued)

FOREIGN PATENT DOCUMENTS

EP           902102 A1 * 3/1999
JP      H01-127132      5/1989

(Continued)

OTHER PUBLICATIONS

Beckenhauer et al. Effect of heating rate on the recrystallization temperature of tantalum, Journal of Materials Science Letters, 1993, vol. 12, p. 449-450.*

(Continued)

*Primary Examiner* — Roy King
*Assistant Examiner* — Xiaowei Su
(74) *Attorney, Agent, or Firm* — Wegman, Hessler & Vanderburg

(57) ABSTRACT

A method of making sputter targets from a BCC metal or BCC metal alloy is provided. The ingot is e-beamed melted and subjected to vacuum arc reduction. The ingot is then tri-axially forged, keeping the centerline of the ingot in the center of the ingot during the tri-axial forging step. The ingot is then vacuum annealed and clock rolled. During the clock rolling, the center line of the ingot is maintained in the center of the ingot and perpendicular to the compressive forces used during the clock rolling. The clock rolled ingot is then vacuum annealed and provided in a near net shape for usage as a sputter target. Tantalum target materials are disclosed having a purity of at least 99.5% and an interstitial content (CONH) of less than about 25 ppm. Tantalum targets, in accordance with the invention, have a grain size of about 50 to 100 microns and a mixed {100}/{111} texture with a higher % {111} gradient towards the center.

7 Claims, 8 Drawing Sheets

(51) Int. Cl.
*C22F 1/16* (2006.01)
*C22C 27/02* (2006.01)
*C22F 1/18* (2006.01)

(56) References Cited

U.S. PATENT DOCUMENTS

| | | | |
|---|---|---|---|
| 5,531,088 | A | 7/1996 | Inatani |
| 5,809,393 | A | 9/1998 | Dunlop et al. |
| 6,113,761 | A * | 9/2000 | Kardokus et al. ........ 204/298.13 |
| 6,348,139 | B1 * | 2/2002 | Shah et al. .................... 148/422 |
| 6,462,339 | B1 | 10/2002 | Michaluk et al. |
| 6,872,284 | B2 | 3/2005 | Ivanov et al. |
| 6,878,250 | B1 | 4/2005 | Segal et al. |
| 6,887,356 | B2 | 5/2005 | Ford et al. |
| 6,893,513 | B2 | 5/2005 | Michaluk et al. |
| 6,946,039 | B1 * | 9/2005 | Segal et al. ................... 148/400 |
| 7,063,773 | B2 | 6/2006 | Ivanov et al. |
| 7,228,722 | B2 | 6/2007 | Spreckelsen et al. |
| 7,998,287 | B2 * | 8/2011 | Wickersham et al. ........ 148/422 |
| 2005/0247386 | A1 | 11/2005 | Matera et al. |
| 2007/0209741 | A1 * | 9/2007 | Carpenter et al. ............ 148/668 |

FOREIGN PATENT DOCUMENTS

| | | |
|---|---|---|
| JP | 2007084931 A | 4/2007 |
| WO | WO0031310 A1 | 6/2000 |
| WO | WO2006086319 A2 | 8/2006 |
| WO | WO2007103309 A1 | 9/2007 |

OTHER PUBLICATIONS

International Search Report and Written Opinion mailed Dec. 23, 2009 for PCT/US2009/005945 filed Nov. 3, 2009.
International Preliminary Report Patentability mailed May 12, 2011 for PCT/US2009/005945 filed Nov. 3, 2009.
Pokross, "Controlling the Texture of Tantalum Plate", JOM, Oct. 1989, pp. 46-49.
Clark et al., "Influence of Transverse Rolling on the Microstructural and Texture Development in Pure Tantalum", Metallurgical Transactions A, Aug. 1992, vol. 23A, pp. 2183-2191.
Briant et al., "Recrystallization Textures in Tantalum Sheet and Wire", International Journal of Refractory Metals & Hard Materials, 2000, vol. 18, pp. 1-8.
Matsunaga et al., "Characterization of NbTiN Thin Films Prepared by Reactive DC-Magnetron Sputtering", IEEE Transactions on Applied Superconductivity, Jun. 2003, vol. 13, No. 2, pp. 3284-3287.
Wright et al., "Scalar Measures of Texture Heterogeneity", Materials Science Forum, Proceedings of the 14th International Conference on Textures of Materials held in Leuven, Belgium, Jul. 11-15, 2005, vols. 495-498, pp. 207-212.
Desrayaud et al., "A Novel High Straining Process for Bulk Materials—The Development of a Multipass Forging System by Compression Along Three Axes", Journal of Materials Processing Technology, Feb. 2006, vol. 172, pp. 152-158.
Anonymous, "Crystallographic Texture of a Ti—Nb-Based BCC Beta-Titanium Alloy After Warm Rolling and Recrystallization", Max-Planck-Institut fur Eisenforschung GmbH, Oct. 2008, pp. 1-9.
English Translation of Japanese Patent Office Action of May 13, 2014 issued in Japanese Patent Application No. 2011-534527.

* cited by examiner

METHOD OF MAKING A SPUTTER TARGET AND SPUTTER TARGETS MADE THEREBY

CROSS-REFERENCE TO RELATED APPLICATION

This application claims the priority benefit of U.S. Provisional Patent Application Ser. No. 61/198,098 filed Nov. 3, 2008.

BACKGROUND OF THE INVENTION

The present invention pertains to sputter target and methods of making same. Physical vapor deposition (PVD) relates to a variety of vacuum deposition techniques in which thin films are deposited onto a desired substrate via condensation of a vaporized form of a source material. The coating method involves purely physical processes including plasma sputter and vacuum evaporation in contrast to processes that involve a chemical reaction as in chemical vapor deposition (CVD) methods.

Cathodic sputtering is one PVD form that is widely used for the deposition of thin layers of material onto substrates. Basically, a sputtering process requires gas ion bombardment of a target formed from a material that is to be deposited as a thin film or layer on a given substrate. During such a process, the target is positioned such that a sputtering surface of the target faces the substrate across a chamber which has been evacuated and refilled with an inert gas, preferably argon. A high voltage electrical field is applied between the target, which acts as a cathode, and an anode located near the sputter target. The electric field induces electrons drawn from the cathode to collide with the molecules of the inert gas, thereby ionizing the gas. Positively charged gas ions are attracted to the cathode, where the ions dislodge minute quantities of material from the sputtering surface. The dislodged target material traverses the evacuated enclosure and deposits to form the thin film on the substrate.

Tantalum has been increasingly used as a primary diffusion barrier material for Cu interconnects that are employed in a variety of microelectronic device circuits. Ta or Ta/N barrier films are deposited via cathodic sputtering processes in which Ta source material, i.e., a Ta sputter target, is eroded by the high energy plasma.

Target grain size, purity, and texture are regarded as important properties related to the desire to provide uniformity in thickness and composition of films coated by Ta and other sputter targets. A variety of metal working processes have been employed in the fabrication of sputter targets with the goal of providing effective, inexpensive methods in which desirable target properties can be achieved.

SUMMARY OF THE INVENTION

In one exemplary embodiment, the invention pertains to a method of making a sputter target from a BCC metal or alloy. An ingot of BCC metal or metal alloy is provided and tri-axially forged. The centerline of the ingot defines a central axis of the ingot and is maintained in the center of the ingot during the tri-axial forging. The process further comprises vacuum annealing of the ingot in a first annealing step and clock rolling the ingot while the centerline is maintained in the center of the ingot and perpendicular to the compressive forces used during the clock rolling. The ingot is further vacuum annealed in a second annealing step, and then the desired shape is imparted to the ingot to result in a near net shape sputter target.

In alternative embodiments of the invention, the ingot is extruded prior to the tri-axial forging step. The annealing steps may be conducted at temperatures of from about 950°-1300° C., and the clock rolling may be conducted at ambient temperatures. The clock rolling may include two clock rolling operations. In the first operation, in accordance with one embodiment, at least a 50% reduction of area is achieved. In another embodiment, the second clock rolling operation, also conducted at ambient, results in an additional 60% area reduction or more.

In still further embodiments of the invention, the target is annealed in an intermediate annealing step between the first and second clock rolling steps. This intermediate annealing can be conducted at temperatures of about 1000° to 1200° C.

In other aspects of the invention, the first annealing step is performed prior to clock rolling, and the final annealing step is performed after the second clock rolling. Additionally, in other embodiments, at least a portion of the tri-axial forging is provided under heated conditions of about 800° C.

BCC metals may be subjected to these processes with particular metals of interest being Ta and Nb/Ti alloys. In another preferred embodiment, the ingot is e-beam melted followed by vacuum arc remelting of the ingot.

In further aspects of the invention directed toward the BCC metal itself, a tantalum metal is provided having a purity of at least 99.5%, preferably 99.995% or greater. The Ta has a CONH content of less than about 25 ppm and a grain size of about 50 to 100 microns. The metal is further characterized by a predominant {111} texture with a gradient towards the midpoint of the thickness.

DETAILED DESCRIPTION

Figure 1:
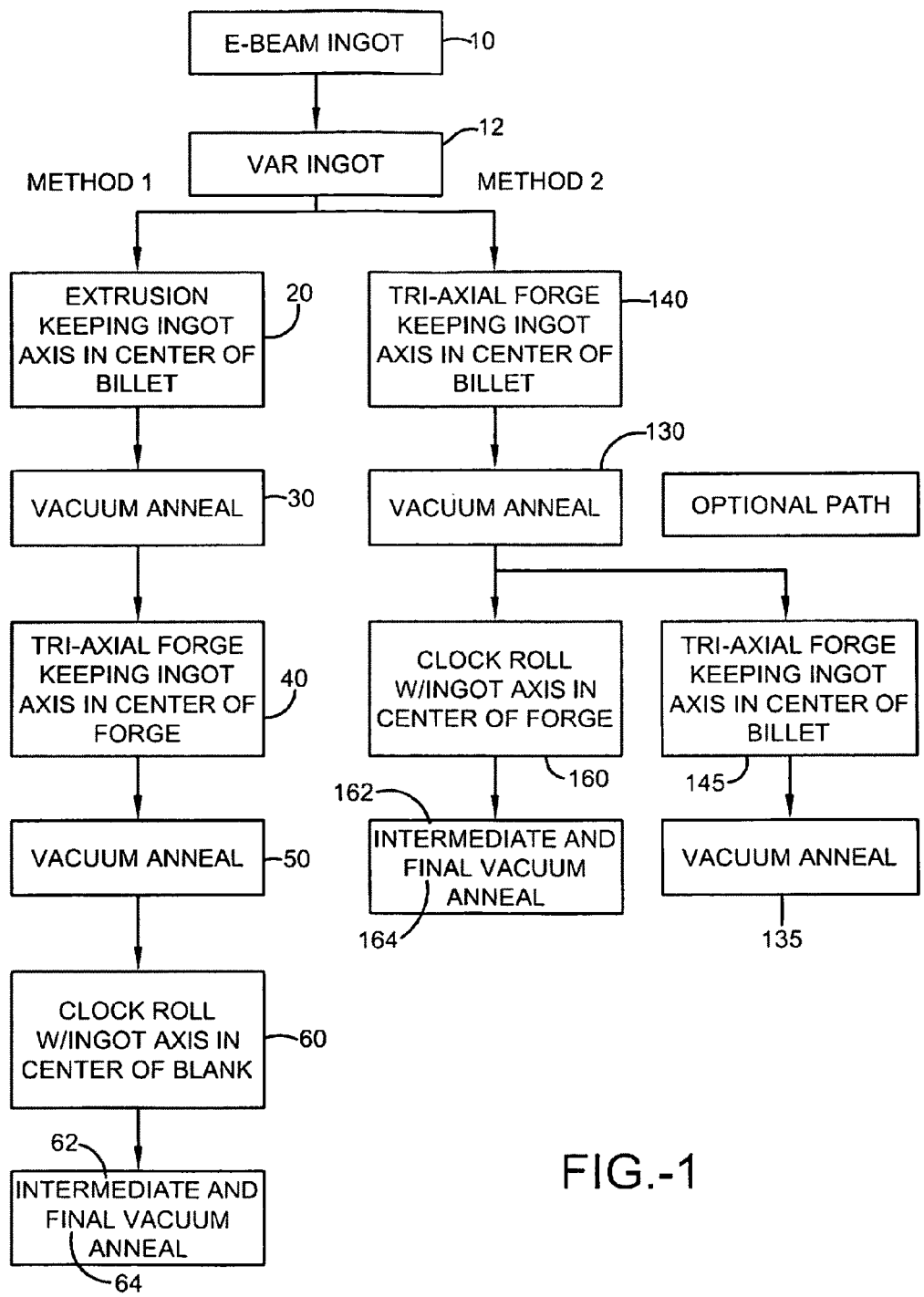
FIG. 1 is a flow chart illustrating various embodiments of the invention.

In one of its exemplary embodiments, the invention relates to methods of making sputter targets of the type used in physical vapor deposition (PVD) methods in which the target is composed of a BCC (Body Centered Cubic) refractory metal. These metals include Ta, Nb, V, Mo, and alloys thereof. Exemplary alloys include Nb/Ti alloys wherein the Ti is present in an atomic percent amount of from 0.5 to 95% Ti; more specifically 1 to 65 atomic percent Ti. These NbTi alloys may be of interest as barrier materials for copper interconnects in semiconductor applications. Other aspects of the invention are drawn to highly pure Ta production methods and PVD targets composed of Ta.

In accordance with one aspect of the invention, the process involves the remelting of an e-beam ingot in a vacuum arc furnace (VAR) to refine the e-beam melted grain structure. This process does not adversely affect the chemical purity of the ingot. In one embodiment, the VAR ingot is extruded and upset forged in all three axes (X, Y, and Z) to further refine the structure. Then it is annealed. In another embodiment, the VAR ingot is simply upset forged in all of the three axes followed by vacuum annealing. In both of these embodiments, the parts are clockwise cross rolled with the initial ingot axis maintained in the middle of the plate and perpendicular to the roll compression forces. An intermediate anneal is then given to the ingot after a minimum of 50% area reduction has been achieved via the initial clock rolling operation. Then after another clock rolling step results in an additional 60% area reduction, a final anneal is given to the ingot. These processes produce a fine grain homogeneous structure with a known {100}/{111} to {111} gradient established in the industry as standard. The texture gradient may be varied by changing the intermediate anneal step and increasing the % reduction prior to final annealing. This will produce a fine grain 50 to 70 micron plate with a {111}{100} mixed texture with a higher % {111} towards the midpoint of the thickness.

Another exemplary embodiment involves upset forging (multiple axis) a VAR Ta ingot of CONH less than 20 ppm total and ingot purity between 99.5 and 99.9995% purity from an ingot 210 mm diameter by up to 400 mm to a bar of 125 mm in diameter by 1125 mm. The bar is then cut into individual size pieces, and the multiple upset forge step at room temperature is repeated. The billet is then annealed between 950 and 1300° C., pressed to an area reduction of 40-70%, further annealed between 950 and 1300° C., compression rolled to a minimum of 50% area reduction, and then the billet is given a final anneal between 950 and 1300° C. To produce a texture of {111} dominant material (>50% {111}), the anneal temperatures must be kept below 1000° C. To produce a more mixed {111}/{100} texture, the annealing temperatures should be closer to 1200° C. at the forging steps and near 1100° C. during pressing and compression rolling. These methods should aid all BCC refractory metals being processed into sputtering target blanks either for planar or 3D targets such as hollow cathode magnetron targets.

Turning now to FIG. 1, there is presented a schematic process diagram showing the steps involved in various exemplary embodiments. As shown, an e-beam melted ingot 10 is provided. This ingot may comprise any BCC metal such as Ta, Nb, V, and Beta Ti and alloys thereof. Preferably, the purity of the e-beam ingot is from 4N to 5N, and the interstitial content of the metal (meaning the amount of C, O, N, and H present) is less than 25 ppm. The e-beam ingot is then subjected to vacuum arc remelting (VAR) 12 using the Ta ingots as consumable electrodes whereby a more uniform and finer initial grain size are produced as compared to electron beam remelting. Also, vacuum arc remelting reduces the number of multiple direction upset forging steps necessary to achieve uniform grain size and texture.

In accordance with one embodiment of the invention, the ingot is then upset forged in an extrusion press at about 800° C. while it is encased in a copper alloy to keep it from oxidizing. Here, successive pressing steps may be provided so that the overall diameter of the billet increases about 35 to 60% as compared to the diameter of the starting VAR melted ingot.

In one of the embodiments shown in FIG. 1, the ingot is then extruded four times as shown at 20 while keeping the centerline in the center of the billet perpendicular to the compression force utilized during the extrusion process. The billet may then be vacuum annealed as shown at 30, for a period of 1 to 4 hours under a temperature of about 700 to 1000° C.

The ingot or billet may then be cut into the desired lengths via conventional methods such as sawing, water jet, laser jet, e-beam, or the like. It is then subjected to a tri-axial forging step 40 in which the ingot axis is maintained or kept in the center of the billet. In addition to forging in a direction perpendicular to the ingot axis, this tri-axial forging comprises steps of turning the billet so that the centerline thereof is parallel to the compressive forces utilized during the forging steps, with the billet being rotated around the axis through successive forging steps so that, in one embodiment, the resulting billet is substantially round in cross section and has about a five-inch diameter.

Each of the billets or target blanks is then cold pressed perpendicular to the central ingot axis so as to flatten to a specified height. In one exemplary embodiment, the resulting height may be from 1.6 to 1.7, preferably 1.625 inches, as measured along the center line (CL). The billet is then annealed as shown at 50 under vacuum conditions at about 1100° C. for one hour.

The target blanks are then ready for a clock rolling step 60 which involves multiple passes at varying angles through compression rolls. The clock rolling is conducted with the CL being perpendicular to the compressive forces. In one embodiment, the target blank is clock rolled in the rolling mill to achieve approximately a 50-60% thickness or area reduction, and then followed by an intermediate annealing at about 1050 to 1100° C. In one embodiment, this intermediate annealing 62 is followed by an additional clock rolling step including multiple rolls of the disc or billet through compression rolls to gauge after another 60-70% area reduction. A final annealing may be undertaken at 1000° C. for three hours.

The target blank is then milled or otherwise formed into its end use shape, and cleaned via conventional techniques such as machine/grinding, sandblasting, and/or acid etching. It is then ready for bonding to a suitable backing plate in order to form a target/backing plate assembly. In one embodiment, a Ta target is provided, and this target is HIPed to an aluminum backing plate at approximately 565° C. Other bonding techniques, including soldering, brazing, welding, hot pressing, etc., can be used to join the target and backing plate.

In another embodiment shown in FIG. 1, in which an extrusion process is not used, the VAR ingot 12 is tri-axially upset forged as shown at 140. Then it is cut into the necessary billet sizes. The tri-axial forging step 140 is again performed with the CL of the ingot being maintained in the center of the billet. In this embodiment, the billets from the tri-axial forging stage are then subjected to a vacuum anneal 130 at temperatures of 1000 to 1200° C. for a period of 1 to 4 hours.

Next, the so forged billets are subjected to a clock rolling 160 of the type referred to above in which the center line of the axis or billet is maintained perpendicular to the compressive forces. The clock rolling may comprise, for example, six passes through the compression rollers followed by an intermediate annealing step 162 with a subsequent clock rolling providing about 10 passes through the compression rollers. The initial clock rolling step may result in an area reduction of 50% with the second clock rolling step providing an additional 60% reduction in area. The target blanks are then ready for a final annealing 164 at 1000° C. for a period of 1 to 4 under vacuum conditions.

As shown along the right hand side of FIG. 1, in another exemplary embodiment, an additional tri-axial forging step 145 may be utilized after the first vacuum annealing step 130 with this optional tri-axial forging step 145 being followed by an optional vacuum annealing step 135 in which the forged billets would be subjected to furnace temperatures of between about 1000 to 1200° C. for about 1 to 4 hours under vacuum.

The application will be further described in conjunction with the following example which should be construed as being illustrative of an embodiment of the invention and should not be interpreted to limit or narrow the invention.

EXAMPLE

An e-beam melted Ta ingot was obtained. The ingot had a purity of greater than 4N5 and an interstitial (i.e., C, O, N, H) purity of less than 20 ppm. This ingot was then vacuum arc remelted (VAR) in a vacuum arc furnace. The arc potential was 38 volts and a current between 20,000 and 22,000 amps. After VAR, the ingots were cleaned to remove scale and defects. The ingot was sampled for total purity and found to have a total purity of greater than 4N5 and an interstitial purity of less than 20 ppm.

The VAR ingot had a diameter of about 226 mm. This ingot was then encased in an extrusion press and covered with a Cu alloy layer in order to inhibit oxidation. It was then hot upset forged, i.e., keeping the center axis (CL) of the ingot perpendicular to the opposed upper and lower dies. The ingot was maintained at a temperature of 800° C., and the diameter of the ingot was increased to about 320 mm.

The ingot was then extruded at a temperature of 800° C. while still encased in a Cu alloy to inhibit oxidation. In the extrusion process, the ingot was trimmed and passed through a reduced diameter cylindrical die resulting in a narrowing of the ingot diameter to about 170 mm. The CL of the ingot entering the extrusion die was maintained in the same orientation throughout the extrusion process so that the narrowed billet exiting the extrusion die had a CL oriented congruently with the CL of the ingot fed to the extrusion die. The CL was positioned perpendicular to the plane of the compression force used during the extrusion.

The resulting billet was cleaned and sawed perpendicular to the CL resulting in a plurality of discs having a diameter of about 6 inches and a length (as measured along the CL) of about 1.875 inches. Each of the billets was forged while keeping the CL in the center of the blank. This forging commenced with an initial step in which the blank was turned on its axis so that the CL was parallel to and located between the dies. This resulted in a narrowed diameter of about 5.5 inches. Each blank was then rotated through 90° and again pressed, followed by alternating 45° rotation with pressing and 90° rotation with pressing. The billets were rotated and pressed parallel to the centerline until a resulting diameter of about 5 inches was obtained.

The blanks were then pressed normal to the CL so as to obtain the desired height of about 1.625 inches. Each blank was then vacuum annealed at 1100° C. for 1 hour. Each target blank was then clock rolled in a rolling mill, keeping the CL of the blank in the center of the blank and normal to the compressive forces. This resulted in an area reduction of about 50%. Next, the blank was annealed at a temperature of 1100° C. for a period of one hour. The blanks were clock rolled again, keeping the VAR ingot CL in the center of the blank and perpendicular to the compression rolls. This resulted in a 60% area reduction. The blanks were then subjected to a final annealing at 1000° C. for 1 hour. Blanks so formed were machined and then cleaned so that they would be ready for use as sputter targets.

Ta targets from blanks made in accordance with this example had grain sizes of about 50-75 microns. The texture was predominately {111} averaged throughout the thickness of the target. However, when the through thickness texture was examined, there was a gradient from the surface to the mid-plane from both surfaces. The material near the surface was a mixture of (100) and (111) and the amount of (111) increased towards the center. The presence of a texture gradient is normal for tantalum plate processed by rolling. Traditionally, single plane texture measurements using X Ray Diffraction provide little insight into texture gradients. The use of Electron Back Scatter Diffraction in an SEM can provide individual grain orientation information. Attempts to make this a quantitative technique have not yet been fully accepted by the scientific community.

To quantify the texture components, variation through thickness (gradient and banding), a method was cooperatively developed by leading tantalum sputter plate suppliers and users that allows the features to be measured independent of one another. In rolled tantalum plate, the texture is nominally symmetrical about its mid-thickness center line and each half (upper and lower) can be analyzed separately and compared. The through thickness sample is measured in an SEM with Electron Back Scattered Diffraction capability and a two dimensional map is collected as an EBSD data file. The 'as-measured' orientation is in the transverse plan and each data point is rotated to show the texture in the plate normal orientation (ND). Each data point has a texture orientation and individual grains can be indexed. The pixel by pixel data is used in the following analysis.

The original EBSD data can be converted from multi color maps representing all possible textures to three primary colors. (EBSD color maps as shown for example in FIGS. 2B, 4, and 5). The primary colors were chosen because they show up in equal contrast in a display. Any points that did not index within a 15° cut-off for the three textures being analyzed are presented as the color gray and do not count in the volume fraction of analyzed textures (Ftotal).

For calculation, the entire data set is broken into thin slices perpendicular to the x direction (thickness direction). The crystallographic texture is averaged (over the y direction) in each slice. The width of each slice is the x-step distance. It is specified as an integer multiple (n-step) of the minimum e-beam stepping increment in the x direction used to create the pixel map. Usually an n-step of 1 is used. It can be larger if the e-beam stepping distance was set very small compared to the grain size. The EBSD step size should be set to about ⅓ the average linear intercept (ASTM E112 Grain Size method). The analysis area should be at least 100 steps wide (RD rolling direction).

The strengths of the components (100//ND and 111//ND are normally the two major components in tantalum plate) are measured as the area percentage of each half thickness, using a 15° cut-off. For the analysis of a two dimensional EBSD map, only three texture components are analyzed: {100}, {110} and {111}. Four arrays (each of length n-count) are needed to receive the data from the EBSD input file, i.e., F100, F110, F111 and Ftotal. For each point in the pixel map, the x-location (thickness direction) determines the index location for updating calculation arrays:

$$\text{Index} = \frac{\text{'x - location'}}{\text{'x - step'}} + 1$$

The Euler angles $\Phi$ and $\phi_2$ determine the location of the target surface normal (Nt) within orientation space. These two angles, respectively, can range from 0 to 90° and from 0 to 360°. For each pixel in the data file, it is necessary to calculate the angle of Nt with each orientation direction for the relevant texture components. For the three components there are 26 angles to calculate. By applying crystal symmetry operations, the ranges for $\Phi$ and $\phi_2$ can be reduced. The smallest angle found determines the texture component 'candidate'. That angle is compared to the "cut-off" angle—chosen as 15°. If the angle is less than the "cut-off" angle the candidate array is incremented (i.e., F100(index)=F100(index)+1). The total count array is increments (Ftotal(index)=Ftotal(index)+1).

Once the calculation for all of the pixel data points has been completed as outlined above, the volume fraction of the texture component has been calculated as a function of depth direction (x) with a depth resolution of x-step.

Each texture component is analyzed by moving the window across the analysis area and collecting the F(hkl) in each window. The value of F(hkl) is plotted by the location (center of the window). The data can be smoothed by creating a band or window larger than x-step and averaging the volume components within the band or window. The volume fraction data is plotted as the average value within the band at each x step location.

Figure 2B:
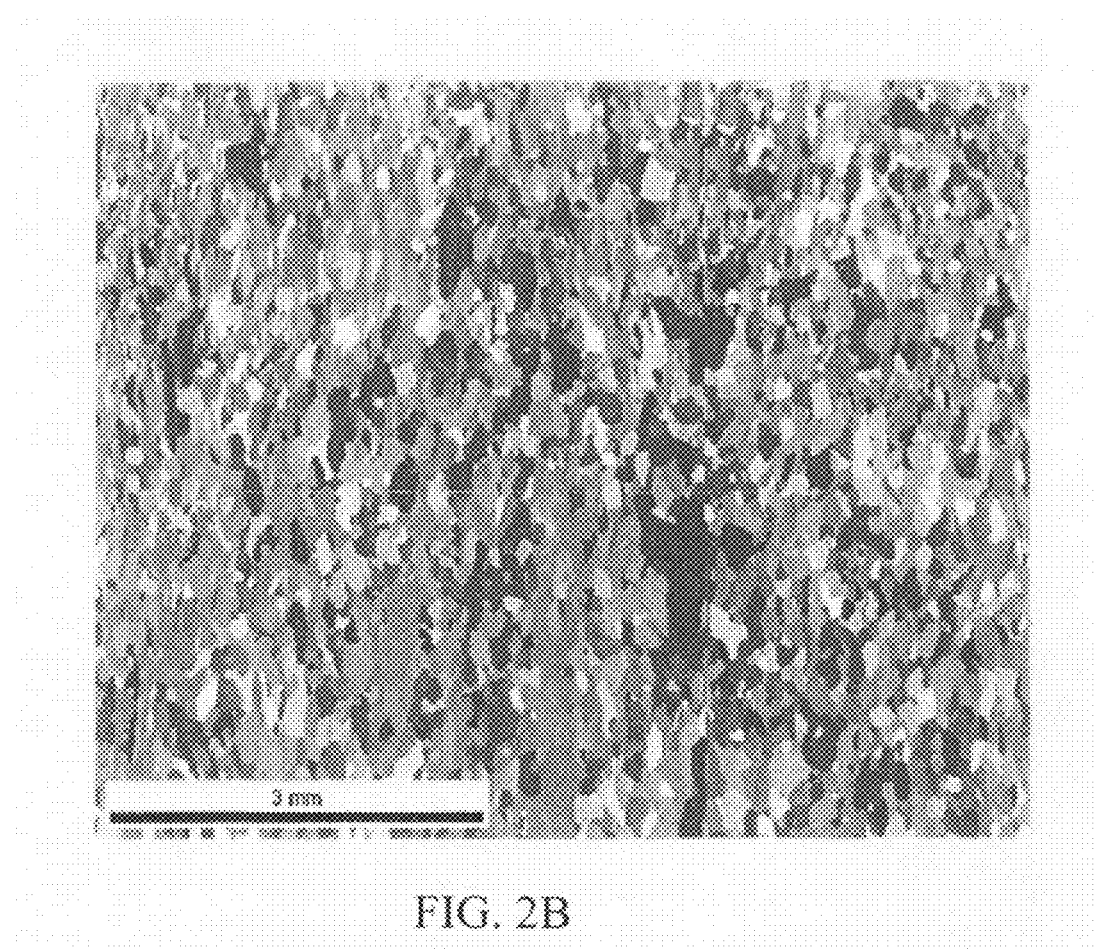
FIG. 2B is an electron back scattering diffraction (EBSD) color map of the target mid-radius through thickness of a blank made in accordance with the example.
Figure 3:
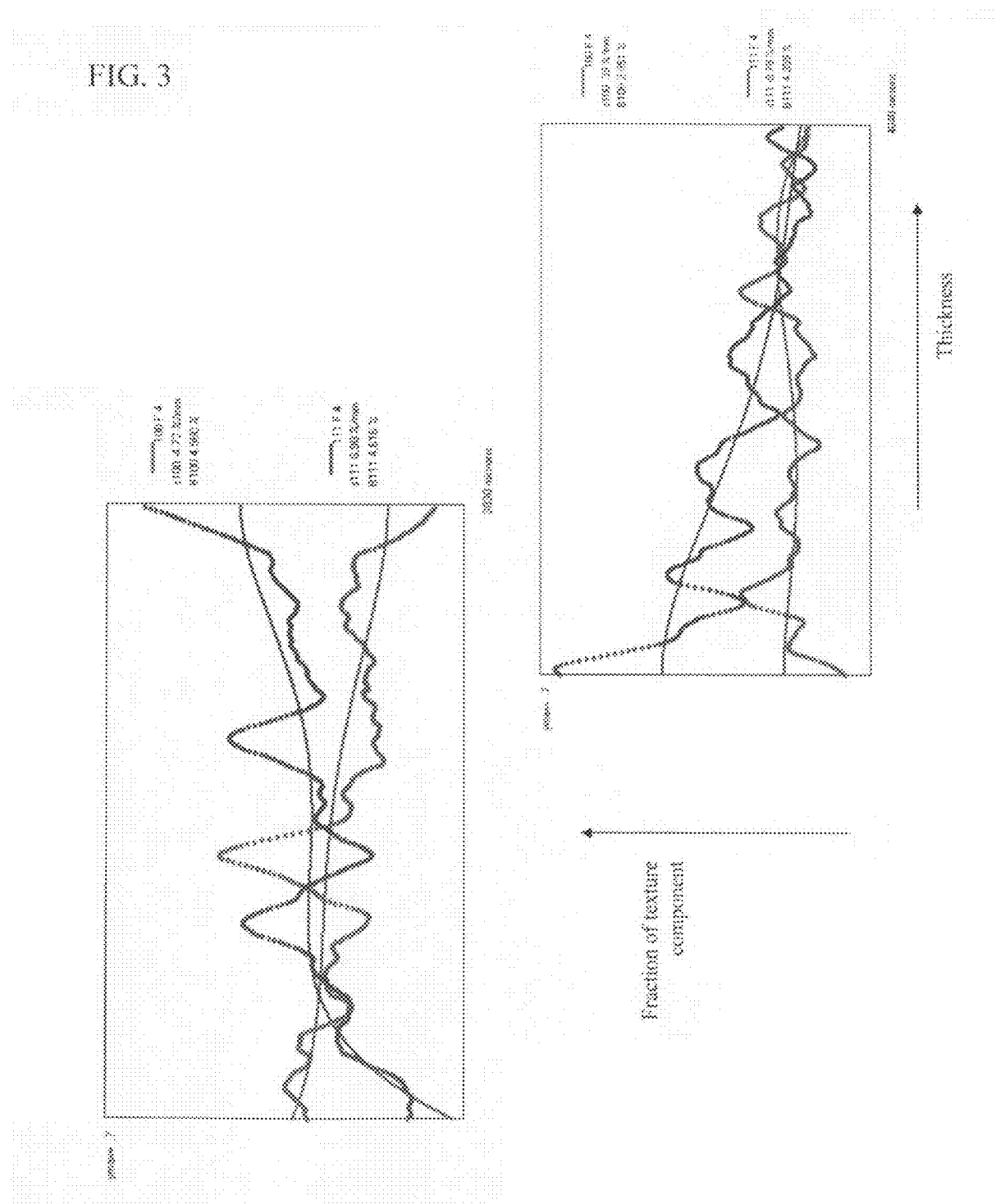
FIG. 3 is a graph of the {111}/{100} texture gradient through the thickness of one of the blanks made in accordance with the example.

Once the area fractions F(hkl) are known from each window location, the data can be fitted to a line using a least squares method (linear regression). The slope of the line is the texture gradient with units of area fraction/distance (%/mm). FIG. 3 shows the F(100) and F(111) for the EBSD map in FIG. 2B with the best fit lines drawn in. The gradient must be calculated for only the half thickness. Both halves of the sample can be measured to determine the symmetry of the plate.

For banding, the F(hkl) lines can be fit to a polynomial of order 4 or less and the average deviation of the data to the polynomial (absolute value of the difference) is used as the banding severity number. The polynomial accounts for the non-linearity of the gradient and avoids over estimating the banding as a result. Noise is also an issue with the banding calculation.

In an EBSB analysis, a very small number of grains are analyzed compared to traditional X-ray diffraction texture analysis of individual planes (thousands versus millions). The relatively low number of grains available for the analysis results in a low signal to noise ratio. To estimate the noise level, random textures can be assigned to all the points in the analysis grid (all EBSD points) and the same analysis completed. A banding number greater than zero will be the result. By running the noise calculation multiple times, an average random noise can be determined and compared to the result from the actual data set. The EBSD measurement method is powerful but time consuming. To accumulate data from the same number of grains as traditional XRD would be impractical. To aid in the analysis, a computer program can be written to automatically do the calculations from the EBSD data file and provide the results in graphical form as in FIG. 3. Such a program was created and made available to the members working together to develop the method.

For tantalum plates, a texture gradient is expected but this gradient can be very different based on the thermo-mechanical processing route chosen. Tantalum plates with a gradual transition from a mixed {100}{111} near the surface to a middle layer rich in {111} provide good sputtering properties. This method is superior to previous methods for quantifying the texture since it shows the actual values of the components rather than a ratio.

In samples where the 110 component is small compared to the 100 and 111 components (as in the example), it may be ignored.

Figure 2A:
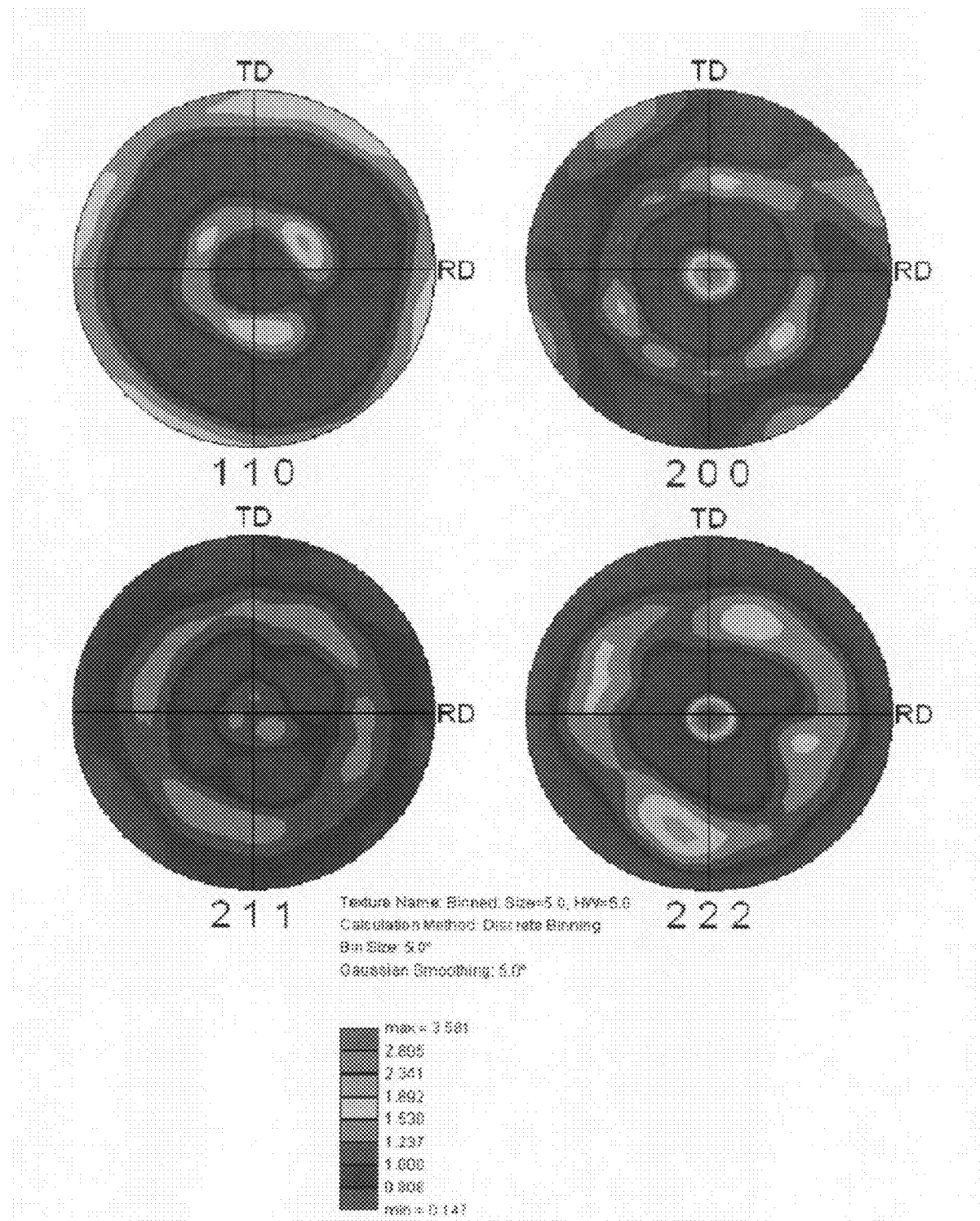
FIG. 2A is a pole diagram showing the {110}, {200}, {211}, and {222} textures of one of the blanks made in accordance with the example.

FIG. 2A is a pole diagram showing {110}, {200}, {211}, and {222} textures in one of the blanks made in the above example indicating a strong {111} texture throughout the target blank. FIG. 2B is an Electron Back-Scattering Diffraction (EBSD) color map of the target mid radius through thickness. FIG. 3 is a graph of {111}/{100} texture gradient and banding factors throughout the thickness for one blank made in accordance with the example.

The red and blue lines in FIG. 3 are running averages through the thickness from left to right. The full thickness has been divided into two halves so the surface to middle gradient can be determined. The red is {100}, and the blue is {111}. The texture gradient is the S100 or S111 number in area %/mm. The B100/B111 numbers are "banding" calculations and are the deviation from the fitted line (smooth). As can be seen by the analysis, the {111} is richer in the center while the {100} is fairly uniform throughout. There is evidence of a minor {100} band in the left side.

Turning back again to the texture gradient and banding factors shown in FIG. 3 and derived via the quantification procedures set forth above, the mid-fraction of the target can be seen to have a predominate {111} texture. By "mid-fraction", we mean from about 20% through about 80% of total target thickness is characterized by this texture. Most preferably, the {111} texture is predominate through the central mid-fraction of the target thickness, namely, from about 40-60% through the total target thickness.

In one example (as shown in FIG. 3), the blank was found to have the following texture gradient and banding factors. FIG. 3

Example 1 first half thickness
{111} S111 6.98%/mm
  B111 4.616%
{100} S100 −4.72%/mm
  B100 4.560%
second half thickness
{111} S111 −8.78%/mm
  B111 4.35%
{100} S100 0.39%/mm
  S100 2.851%/mm In another example made in accordance with the same procedure of Example 1, the resulting blank was found to have the following texture gradient and banding factors.

Example 2 first half thickness
{111} S111 8.21%
  B111 6.619%
{100} S100 −2.64%/mm
  B100 7.045%
second half thickness
{111} S111 −11.78%/mm
  B111 8.412%
{100} S100 4.31%/mm
  B100 6.500%

We have found that a {111} texture uniformity of about 4-13%/mm through the top halve thickness of the target is preferable. In one exemplary embodiment, a banding factor for the {111} plane orientation should be from about 0-8% from the top surface, sloping upwardly toward the center of the thickness (as shown in FIG. 3). Note also that the {111} texture uniformity and {111} banding factor, as shown in FIG. 3, are substantially symmetrical relative to a center plane normal to the top and bottom target surfaces (50% through the target thickness) of the target. Stated differently, both the {111} texture uniformity and banding factor appear as substantially mirror images as viewed from the center plane towards the top surface and from the center plane towards the bottom surfaces.

In a preferred embodiment, the {111} texture gradient S111 through the first half thickness of the plate will range from about 6% to about 9%/mm. Preferred {111} banding factors B111 range from about 7% to 0% for this first half thickness (i.e., left side of FIG. 3).

Figure 4:
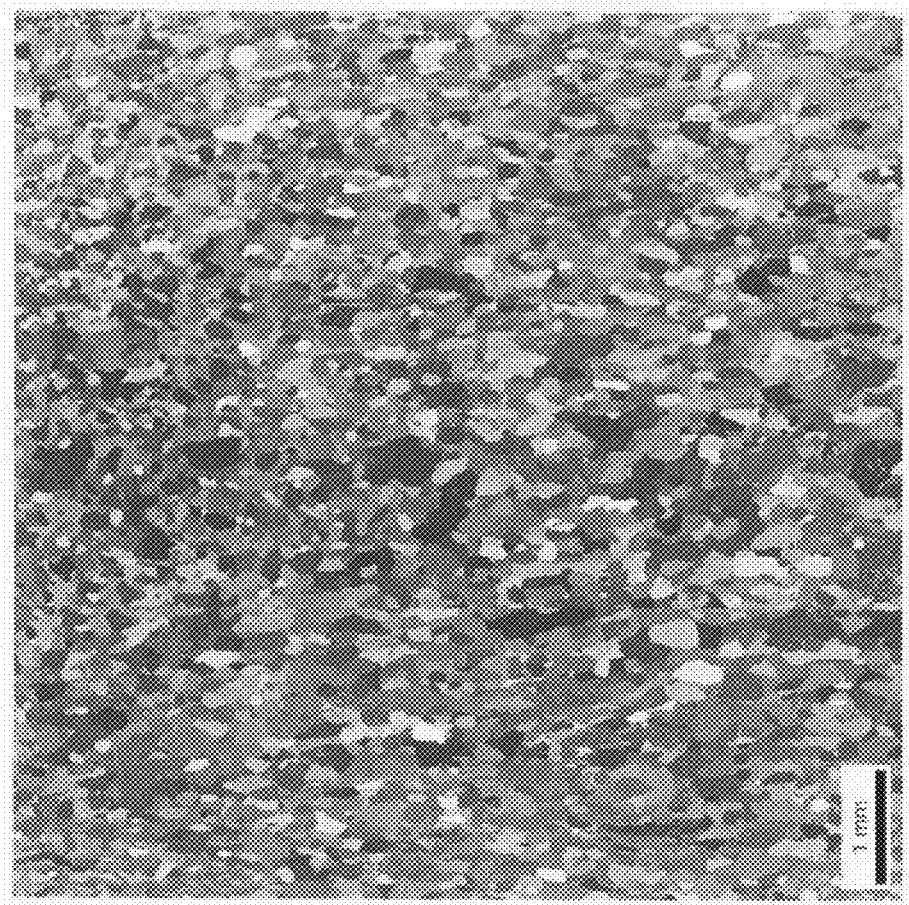
FIG. 4 is a color texture map by EBSD with a color coded inverse pole figure of a blank made in accordance with the example.
Figure 4:
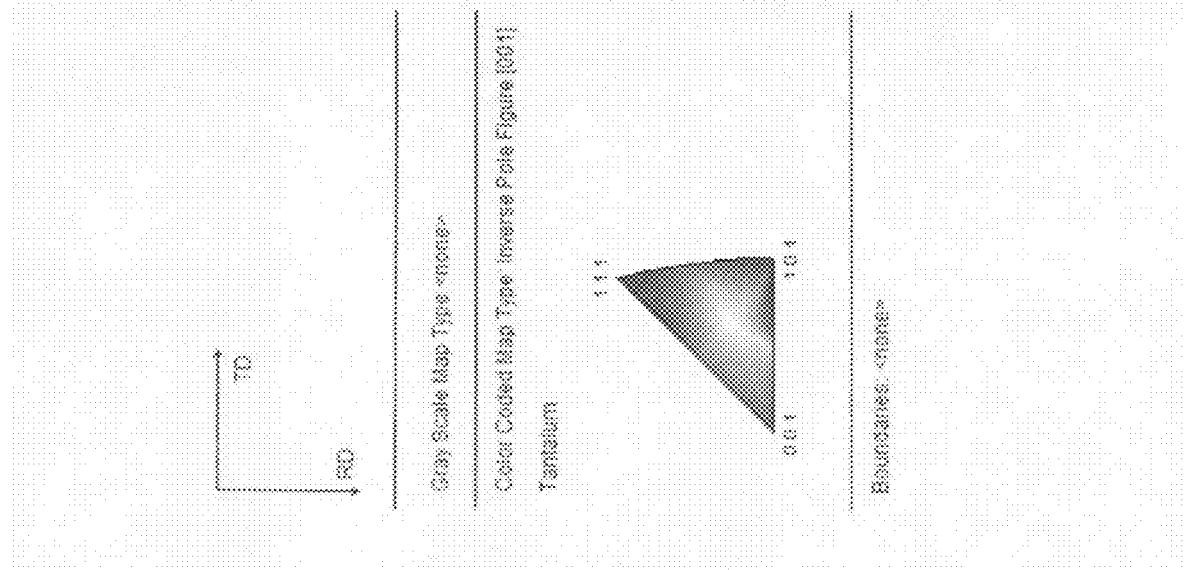
Figure 5:
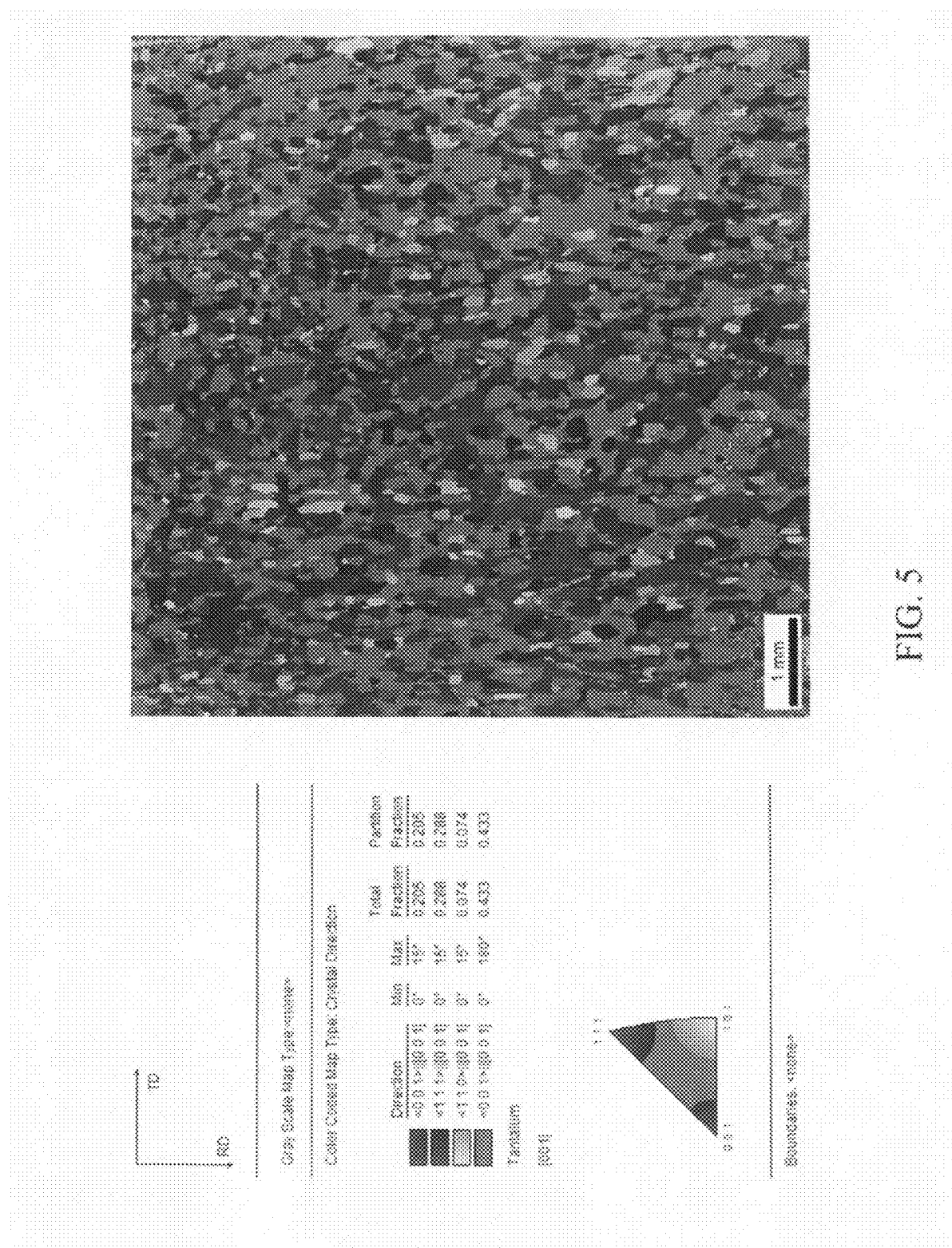
FIG. 5 is an EBSD color map of the same data set in FIG. 4 showing a 15° collection of three textures.

FIG. 4 is a multi color texture map by EBSD with a color coded inverse pole figure. FIG. 5 is a ESBD color map of the same data set seen in FIG. 4 showing a 15° collection of three textures. Any grain within 15 degrees of one of the principal poles is defined as {111}, {100}, or {110}. The {111} (blue) and {100} (red) grains are then averaged across the thickness on each half thickness and plotted to show the gradient of texture. Here, the 100 fraction is 20.5%, and the {111} fraction is 28.8% throughout the thickness of the blank. Both FIGS. 4 and 5 show data for the blank referred to as Example 1. In the blank referred to as Example 2, the resulting {100} fraction was 25.6% with the resulting {111} fraction being 33.5% throughout the blank thickness.

Figure 6:
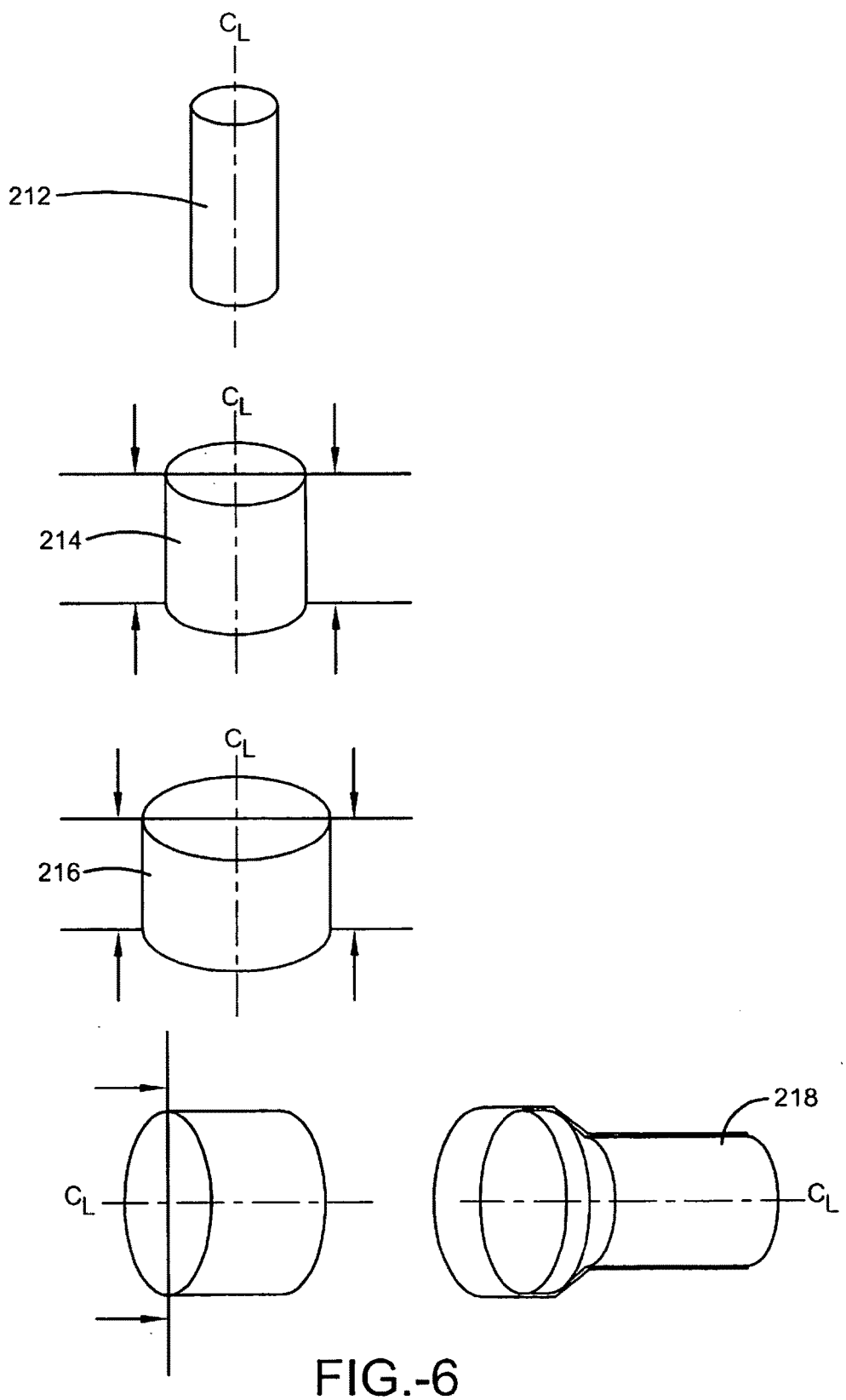
FIG. 6 is a schematic process diagram showing several of the method steps utilized in one embodiment of the invention.
Figure 7:
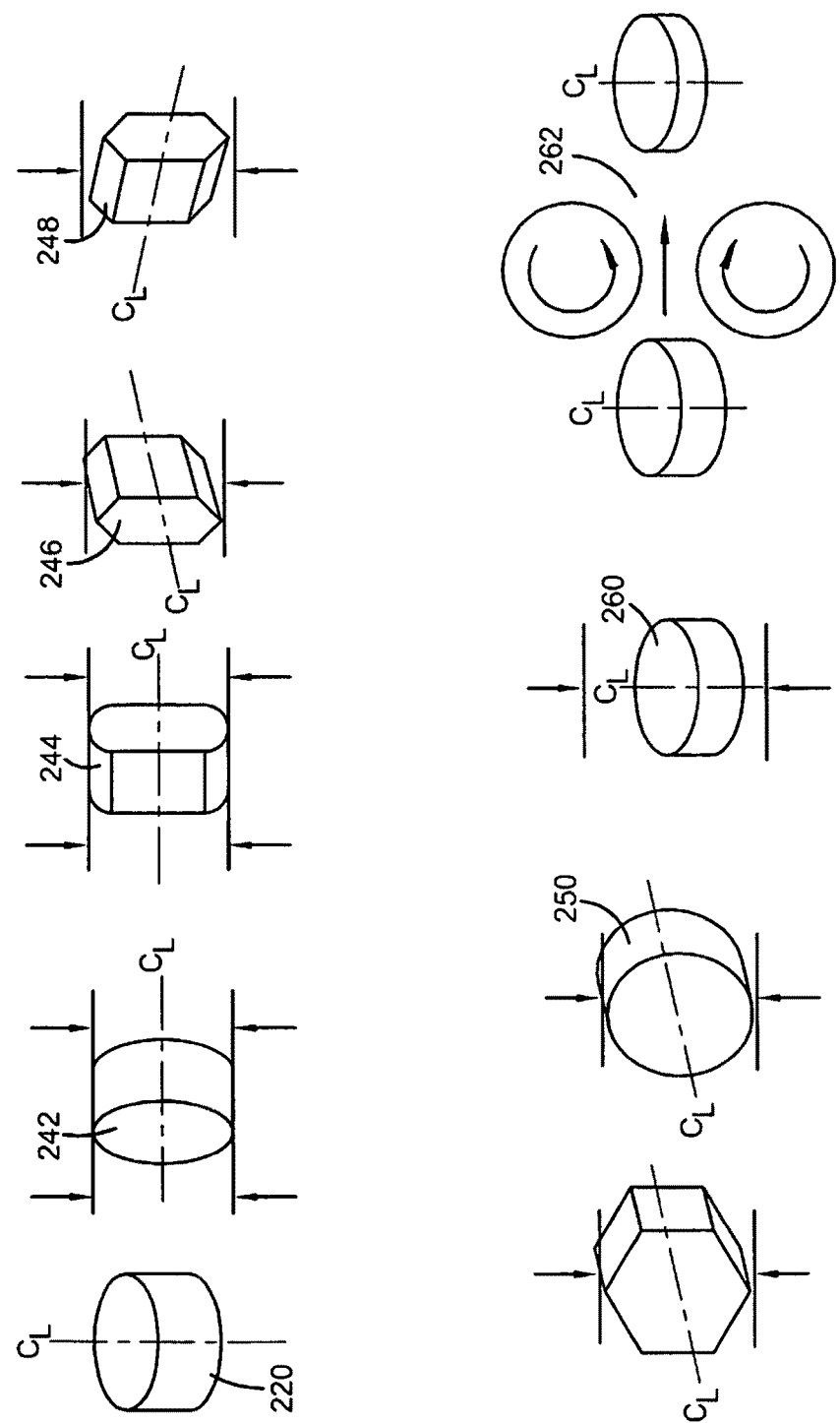
FIG. 7 is a schematic process diagram showing other method steps used in varying embodiments of the invention.

FIGS. 6 and 7 are schematic process diagrams showing one embodiment of the invention when the e-beam and VAR melted ingot is subjected to an extrusion step. Turning to FIG. 6, the ingot 212 has a diameter of about 226 mm and consists essentially of Ta having a purity of about 4N to 5N and a COHN impurity level of less than 25 ppm. The ingot 212 is provided with an initial upset forge as shown at 214 and 216 wherein the forging dies are perpendicularly oriented with regard to the centerline (CL) of the ingot. Here, the ingot is initially pressed, as shown, at 214 in an extrusion press until it has an approximate diameter of about 288 mm. The ingot is encased in a copper alloy to keep it from oxidizing and is heated in an atmosphere maintained at about 800° C. Step 216 shows a further upset forging of the ingot perpendicular to the CL. Here again, the ingot is pressed while encased in a copper alloy, and as a result of step 216, the ingot has a diameter of about 320 mm. Next, the ingot is subjected to an extrusion step shown at 218 wherein the ingot is forced through a reduced diameter die orifice so that the resulting ingot has a diameter of about 200 mm. Once again, this operation is conducted at about 800° C. Note that the CL is maintained in the center of the ingot and in the resulting extruded ingot and the compressive force (as shown by a planar surface) utilized during the extrusion is perpendicular to the CL. If desired, the ingot may be subjected to a second extrusion operation in which an even narrower die orifice is used so that the ingot exiting the second extrusion has a diameter of about 170 mm.

Next, and as shown in FIG. 7, the billet exiting from the extrusion process is sawed or otherwise cut to the required length. Here, the sawed billet 220 has a diameter of around 6 inches and a height as measured along the CL of about 1.875 inches. Next, again as shown in FIG. 7, the billet is turned and subjected to a variety of uniaxial forging steps as shown at 242, 244, 246, 248, and 250. These uniaxial forging steps are all conducted with the CL of the billet parallel to the compressive force, and during this sequence of steps, the billet is turned on the axis (CL) and pressed so that it finally results as shown at 250 in a substantially cylindrical billet having a diameter of about 5 inches. The billet is then turned so that its CL is perpendicular to the compressive forces, and the billet is then pressed to the required height, in this case about 1.625 inches as measured along the CL. The part is then annealed at about 1100° C. for one hour.

As further shown in FIG. 7, the thus pressed part is subjected to a clock rolling step as shown at 262 in which the CL of the billet is maintained perpendicular to planes corresponding to the compressive nip of the rollers. An intermediate annealing step may be conducted at about 1100° C. for one hour between roll passes after approximately a 50% area of reduction has been achieved. The blank can then be further clock rolled to gauge after another 60% area reduction and then finally annealed at about 1000° C. for one hour. The CL of the part is perpendicular to the plane of its upper surface.

Having described the invention by reference to various exemplary embodiments thereof, it will be apparent that modifications and variations are possible without departing from the scope of the invention defined in the appended claims.

What is claimed is:

1. A method of making a sputter target from Ta metal or alloy of Ta metal comprising the steps of:
   a) e-beam melting said Ta metal or alloy of Ta metal to provide an ingot, then remelting said ingot in a vacuum arc furnace (VAR) to provide a VAR ingot;
   b) tri-axially forging said VAR ingot, said VAR ingot having a centerline (CL) defining a central axis of said VAR ingot, said CL being maintained in the center of said ingot during said tri-axial forging wherein at least a portion of said triaxial forging is conducted under heated conditions of about 800° C., performing said tri-axial forging a plurality of times;
   c) vacuum annealing said VAR ingot after each tri-axial forging;
   d) clock rolling said VAR ingot while said CL is maintained in the center of said ingot and perpendicular to compression forces used during said clock rolling;
   e) vacuum annealing said VAR ingot after said clock rolling; and
   f) imparting a desired shape to said VAR ingot to form said sputter target, whereby a Ta sputter target is formed having a thickness dimension and a grain size of from about 50 to 100 microns and a mixed {100}-{111} texture with a 50% or higher % {111} gradient throughout a mid-fraction of said thickness dimension.

2. A method as recited in claim 1 wherein each said vacuum annealing step performed after each tri-axial forging is conducted at a temperature of about 950-1300° C. and wherein said annealing performed after clock-rolling is conducted at a temperature of about 950-1300° C.

3. A method as recited in claim 2 wherein said clock rolling includes a first clock rolling operating at ambient temperature resulting in at least a 50% reduction of area.

4. A method as recited in claim 3 wherein said clock rolling comprises a second clock rolling at ambient temperature and resulting in at least an additional 60% area reduction.

5. A method as recited in claim 3 after said first clock rolling, said ingot is annealed at about 950-1200° C.

6. A method as recited in claim 5 wherein an annealing step is also performed after said second clock rolling.

7. A method as recited in claim 1 wherein said sputter target has a top surface comprising said Ta metal or alloy and wherein said CL is normal to said top surface.

\* \* \* \* \*